US010892397B2

(12) United States Patent
Schwartz et al.

(10) Patent No.: US 10,892,397 B2
(45) Date of Patent: Jan. 12, 2021

(54) SELF-MONITORING SUPERCONDUCTING TAPE VIA INTEGRATED OPTICAL FIBERS

(71) Applicant: North Carolina State University, Raleigh, NC (US)

(72) Inventors: Justin Schwartz, Cary, NC (US); Federico Scurti, Raleigh, NC (US); Samuel Rogers, Raleigh, NC (US); Wan Kan Chan, Raleigh, NC (US)

(73) Assignee: NORTH CAROLINA STATE UNIVERSITY, Raleigh, NC (US)

( * ) Notice: Subject to any disclaimer, the term of this patent is extended or adjusted under 35 U.S.C. 154(b) by 417 days.

(21) Appl. No.: 15/382,046

(22) Filed: Dec. 16, 2016

(65) Prior Publication Data

US 2017/0179364 A1 Jun. 22, 2017

Related U.S. Application Data

(60) Provisional application No. 62/268,527, filed on Dec. 17, 2015.

(51) Int. Cl.

| | |
|---|---|
| ***H01L 39/12*** | (2006.01) |
| ***G01D 5/353*** | (2006.01) |
| ***H01L 39/02*** | (2006.01) |
| ***H01L 39/14*** | (2006.01) |

(52) U.S. Cl.

CPC ....... *H01L 39/126* (2013.01); *G01D 5/35361* (2013.01); *G01D 5/35374* (2013.01); *H01L 39/02* (2013.01); *H01L 39/143* (2013.01)

(58) Field of Classification Search

CPC ......... H01L 39/126; H01B 12/02; H01B 7/32; H01B 12/00; G01D 5/353; G01K 11/32

See application file for complete search history.

(56) References Cited

U.S. PATENT DOCUMENTS

| | | | | |
|---|---|---|---|---|
| 5,458,594 A * | 10/1995 | Mueller | A61C 1/0046 | 606/15 |
| 6,444,917 B1 * | 9/2002 | Scudiere | H01L 39/248 | 174/125.1 |
| 2008/0210454 A1 * | 9/2008 | Fee | H01F 6/06 | 174/125.1 |
| 2008/0262158 A1 * | 10/2008 | Morita | C08L 83/04 | 525/100 |
| 2014/0204368 A1 * | 7/2014 | Lewis | G01D 5/35361 | 356/73.1 |

OTHER PUBLICATIONS

Turenne et al. "Multi-purpose fiber optic sensors for high temperature superconducting magnets." 23rd IEEE/NPSS Symposium on Fusion Engineering. (Year: 2009).*

(Continued)

*Primary Examiner* — Paul A Wartalowicz

(74) *Attorney, Agent, or Firm* — Thomas | Horstemeyer, LLP

(57) ABSTRACT

Disclosed are systems and methods for a self-monitoring conducting system that can respond to temperature, strain, and/or radiation changes via the use of optical fibers. The self-monitoring conducting system comprises a conducting component integrated with one or more optical fibers. The temperature, strain, and/or radiation changes can be sensed or detected via optical interrogation of the one or more optical fibers.

14 Claims, 13 Drawing Sheets

(56) References Cited

OTHER PUBLICATIONS

Chan et al. "Spatial and temporal resolution requirements for quench detection in (RE)Ba2Cu3Ox magnets using Rayleigh-scattering-based fiber optic distributed sensing." Supercond. Sci. Technol. 26 (Year: 2013).*

Boyd et al. "Monitoring distributed temperatures along superconducting degaussing cables via Rayleigh backscattering in optical fibers" Proceedings of the Intelligent Ships Symposium. (Year: 2011).*

Ryu, C., Jang, H., Choi, C., Kim, Y., Kim, H., "Current status of demonstration and comercialization of HTS cable system in grid in Korea," Applied Superconductivity and Electromagnetic Devices (ASEMD), 2013 IEEE International Conference on , vol., No., pp. 539,542, Oct. 25-27, 2013.

Sohn, S.H., et al., Design and Development of 500 m Long HTS Cable System in the KEPCO Power Grid, Korea, Physica C: Supercond. 470 (2010) 1567-1571.

Trillaud, F.; et al., Normal Zone Propagation Experiments on HTS Composite Conductors, Cyrogenics 2003, 43, (3-5), 271-279.

AMSC to Provide Wire for Fault Current Limiter in Europe's Largest Superconductor Grid Project; located at: http://ir.amsc.com/releasedetail.cfm?ReleaseID=736299. (Jan. 29, 2013).

Nexans and AMSC Introduce Fault Current Limiter for North American Utilities; located at: http://iramsc.com/releasedetail.cfm?ReleaseID=725019. (Dec. 5, 2012).

* cited by examiner

SELF-MONITORING SUPERCONDUCTING TAPE VIA INTEGRATED OPTICAL FIBERS

CROSS REFERENCE TO RELATED APPLICATIONS

This application claims priority to, and the benefit of, U.S. provisional application entitled "SELF-MONITORING SUPERCONDUCTING TAPE VIA INTEGRATED OPTICAL FIBERS" having Ser. No. 62/268,527, filed Dec. 17, 2015 and which is incorporated herein by reference in its entirety.

BACKGROUND

Advanced magnet systems being designed for nuclear fusion devices, particle accelerators, magnetic resonance imaging (MRI), energy storage, motors, power generators, and other applications can greatly benefit from the use of high-temperature superconductors (HTS) as they allow magnets to operate at higher magnetic fields. This allows for more compact reactors and elevated operating temperatures, thereby reducing operating costs and improving likely reliability. However, the current HTS magnet designs suffer from the inability to rapidly detect and locate normal zones, raising the possibility that the magnet and associated systems can be damaged if preventative action is not taken fast enough.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 1A is an example of an HTS coil illustrating an optical fiber on a conductor surface. FIG. 1B is an example of an HTS coil illustrating an optical fiber embedded between turns of the conductor.

DETAILED DESCRIPTION

Figure 1A:
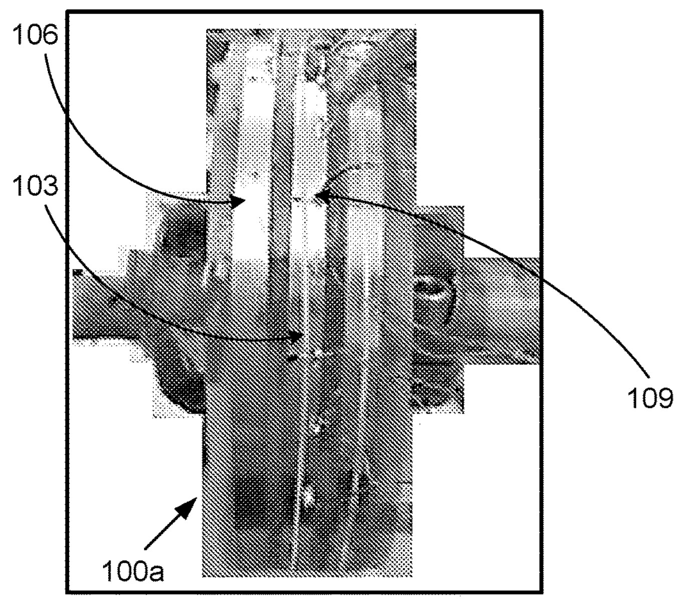
FIGS. 1A and 1B are images of HTS coils comprising an optical fiber that lies outside of the conductor, in a co-wound configuration.

The present disclosure relates to methods and systems for a self-monitoring conductor device that responds to strain and temperature changes occurring at the beginning of a normal zone which may or may not be a precursor to a quench condition. According to various embodiments of the present disclosure, optical fiber sensors can be integrated into HTS tape architectures, such as, for example, rare earth barium-copper oxide (REBCO) tape, REBCO/YBCO coil, bismuth-strontium-calcium-copper oxide (BSCCO) wires and/or tapes, and/or other types of conducting materials that comprise laminate structures. The integration of the optical fiber sensors within the HTS architecture results in a conductor technology that is self-monitoring along its entire length in real-time. A self-monitoring conductor can have distinct advantages for quench detection and protection, and can be used to identify any unexpected and/or expected mechanical strain and/or temperature change within the conductor during magnet manufacturing, cool-down, and operation. The self-monitoring conductor can provide a level of quench protection not available with existing systems and ensure the reliable operation of critical and costly magnet systems. The self-monitoring wire technology can significantly increase the reliability of advanced magnet systems needed for nuclear fusion devices, MRI systems, motors and generators, and particle colliders and detectors for high energy physics (HEP) being planned for critical energy, defense, medical and other commercial applications. This increased reliability will enable the use of HTS architectures in these applications, protect the systems from failure, and extend the lifetime of the systems, ultimately leading to lower costs for both the advanced magnets and systems.

HTS wires can be used in commercial and military applications, such as, for example, fault current limiters (FCLs) deployed in the electrical grid, superconducting magnetic energy storage (SMES) devices, power transmission lines, multiple cable projects around the world, defense applications, rotating machines, and high field magnet applications. As HTS wire is introduced into coils for such critical, expensive applications, it is extremely desirable to be able to continuously monitor the condition of the wire to ensure the coil and the entire system is not damaged due to an unprotected quench. A quench is an irreversible transition of a superconducting magnet to the normal state originating from a normal zone. A normal zone is a region of superconductor within a superconducting magnet carrying an electrical transport current greater than the local critical current and can be generated by adverse events like a failure of the cooling system, a crack in the impregnation or structural material, particle showers in accelerators, mechanical overloads, fatigue and/or any other event that introduces heat into the conductor. Thus, the self-monitoring capability of the present disclosure can be extremely valuable to and impactful for a wide range of energy, high energy physics, commercial, medical, and military application using coils made from HTS wire.

To safely operate a large, high field superconducting magnet, regardless of conductor type, a thorough understanding of the quench behavior of the conductor and magnet is required. A quench is the irreversible transition of a superconducting device to the normal state and it is accompanied by a thermal runaway that can irreversibly damage both conductor and other systems. Any quench starts from a normal zone that grows with time and spreads throughout the system. Although the quench behavior of low temperature superconductor (LTS) magnets is well understood, HTS magnets show distinctly different quantitative behavior. For example, the minimum quench energy (MQE) in HTS magnets is quite high, but the corresponding normal zone propagation velocity (NZPV) is a few orders-of-magnitude slower than in LTS magnets. Thus, while the basic physics of quench behavior is unchanged, from a practical perspective the quantitative differences in behavior dominate. According to various embodiments of the present disclosure, normal zones can be detected and located sufficiently quickly so that a protection system can be activated to prevent irreversible damage.

The aim of any quench protection system is to prevent permanent conductor degradation in the event of a fault condition that induces a normal zone. Quench protection involves three key steps, all of which must be accomplished within a time-budget determined by the rate of growth of a disturbance and the resilience of the conductor: (1) detection of a disturbance or normal zone (also known as a hot-spot), which is historically accomplished via voltage measurements, (2) assessment of the disturbance to determine if it is going to induce a quench while preventing false-positives, and (3) protective action to prevent degradation if the magnet is quenching. For large magnets with a large stored energy, step (3) is typically accomplished through heaters embedded in the magnet and a dump circuit into which the stored energy is dissipated. The key to quench protection is preventing degradation by limiting localized temperature increase relative to the ability to detect and protect within the time available before degradation occurs. To determine the time budget, one must understand both the quench dynamics and the operational limits of the conductors; these two factors determine the time budget for protection. For LTS magnets, the safe operational limits are quantified in terms of a maximum hot-spot temperature, but due to the very slow NZPV in HTS magnets, a "minimum propagating zone" approach is likely to be more effective.

From the perspective of quench protection and the available time-budget, the challenge of slow NZPV is quench detection. Specifically, if the normal zone does not propagate quickly then neither does the detectable voltage signal, which may result in degradation before a protection system can take action. Note that if voltage measurements are used for quench detection, then only the portion of the conductor with a local temperature greater than the current sharing temperature, $T_{cs}$, produces any signal. Thus, by definition, the larger the stability temperature margin, the longer the delay between the onset of a disturbance and a detectable voltage signal. In principle, slow NZPV can expand the time-budget, in which case, the delayed detection would not be problematic as the two effects could cancel (i.e., relative to LTS magnets, everything would be similar but in "slow motion"). This is not the case, however, because traditional quench detection is based upon voltage measurements. Voltage is simply the line integral of the electric field between the two voltage taps. The electric field profile is directly correlated with the temperature profile, so a normal zone with a short, highly peaked temperature profile produces the same voltage as a long normal zone with a relatively low peak temperature. The highly peaked temperature profile, which is the result of a slow NZPV, is more likely to cause degradation. Thus, either significantly enhanced quench propagation is needed, or quench detection needs significantly higher spatial resolution.

Optical fiber sensors have evolved to meet a number of sensing needs in many science and engineering fields and using a variety of interrogation techniques. In general, all of the interrogation techniques are based upon either the transmission or reflection of light propagating in the fiber. One interrogation technique uses fiber Bragg gratings, for which a small Bragg grating is inscribed at one or more locations along the length of a fiber. The spacing of the grating has a characteristic reflection, so changes in the Bragg reflection indicate changes in the spacing between the lines of the grating. As the line spacing changes with either strain or temperature, a simple, fast point-sensor results. For superconducting magnets, however, the Bragg grating approach suffers from being a point-sensor, and thus does not offer improvement in spatial resolution over conventional voltage taps. While one can inscribe multiple gratings on a single fiber, the approach remains intrinsically limited to measurements at pre-determined locations.

Another optical interrogation technique relates to deriving the signal using Rayleigh backscattering. The fundamental principle of Rayleigh backscattering is similar to that of Bragg gratings except that rather than inscribing gratings at predetermined locations on the optical fiber, the light scattered from the naturally occurring defects within the fiber is interpreted through a "Rayleigh interrogator." When the fiber length is changed via a change in strain or temperature, these defects are altered, thus altering the reflected signal. A Rayleigh backscattering interrogator thus compares a reference backscattered spectrum to each subsequent spectra, and the resulting "spectral shifts," which are a function of location and time, translate into the time-varying strain or temperature distributions. Since the spatial resolution is only limited by the wavelength of the interrogating light and by limitations associated with data acquisition and processing speed, the Rayleigh scattering interrogated optical fiber is a true distributed sensor. While other types of interrogating techniques can be used with optical fiber sensing, Rayleigh scattering is a preferred embodiment in the present disclosure.

Figure 1B:
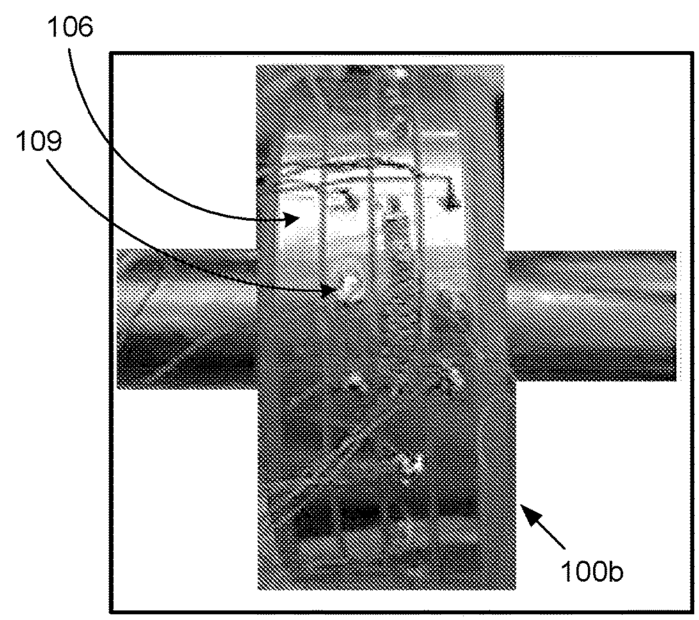

In an experiment, two Rayleigh-interrogated HTS coils 100 (e.g., 100_a_, 100_b_) were studied using a commercially available optical distributed sensor interrogator that was remotely controlled by LabView software. As seen in FIGS. 1A and 1B, the coil 100_a_ in FIG. 1A has the optical fiber 103 on the surface of the HTS conductor 106 and the coil 100_b_ shown in FIG. 1B has the fiber co-wound between turns of HTS conductor 106 where the optical fiber also serves as turn-to-turn insulation. Attached in various positions along the HTS conductor 106 are voltage taps 109 that are used to measure the voltage along the coil 100. In both cases, quench experiments showed a strong spectral shift that appeared much more quickly than the voltage signal measured at the voltage taps 109 that were also mounted on the HTS conductor 106. This is an advantage of optical fibers as voltage taps are intrinsically limited in that there is no signal to detect until the temperature at the voltage tap 109 exceeds $T_{cs}$, whereas the optical fiber detects even a very small local temperature perturbation.

Figure 2:
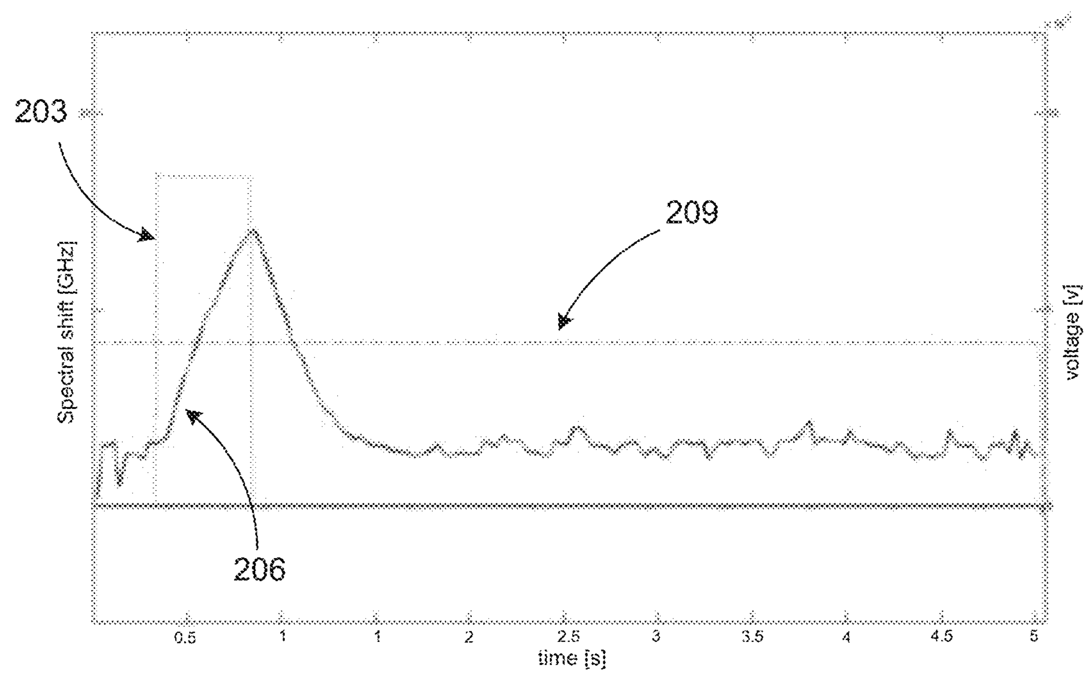
FIG. 2 illustrates an example of a graphical representation of spectral shift associated with the HTS coil of FIG. 1A according to various embodiments of the present disclosure.

FIG. 2 shows the data for an experiment with the fiber 103 atop the conductor tape 106 as shown in FIG. 1A. In this case, the heat pulse 203 (square wave) was insufficient to initiate a quench, yet the spectral shift 206 is clearly seen in the optical fiber 103 as soon as the heat pulse begins, peaking at the end of the heat pulse 203, and then decaying as thermal equilibrium returns. Throughout this example there is no signal 209 whatsoever in the voltage taps. The same result was found for the configuration of FIG. 1B with the fiber wound between the turns of HTS conductor 106.

Figure 3:
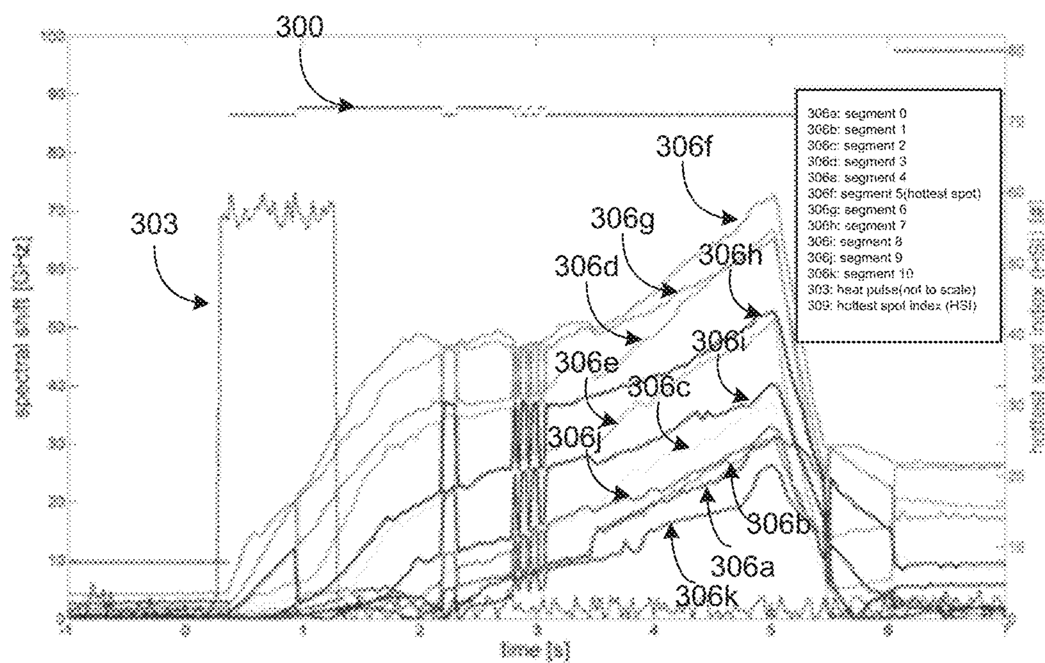
FIG. 3 illustrates an example of a graphical representation of spectral shift associated with the HTS coil of FIG. 1B according to various embodiments of the present disclosure.

In FIG. 3, the spectral shifts 306 (e.g., 306*a*, 306*b*, 306*c*, 306*d*, 306*e*, 306*f*, 306*g*, 306*h*, 306*i*, 306*j*, 306*k*) along the length of the optical fiber 103 are plotted for a case when the heat pulse 303 induced a quench. Specifically, FIG. 3 illustrates the heat pulse 303 (square wave) and spectral shift 306 at ten locations along the optical fiber 103. In this case, the largest spectral shift corresponds to the location of the heater and each pair of curves that nearly overlap are the real-time data for locations located five (5) millimeters (mm) away from the previous pair on either side of the hot-spot. 306*a* corresponds to the hottest spot. Note that the clear spectral signals 306 begin as soon as the heat pulse 303 begins, without any time delay. Clearly seen is the high spatial resolution of the optical fiber 103. This data is the equivalent of having eleven voltage taps 109 on a conductor 106 over a 50 mm length—a prohibitive limitation for monitoring a large magnet. With Rayleigh-interrogation of an optical fiber 103, this is collected with just one fiber 103. In other words, the optical fiber 103 used in this manner provides true distributed sensing.

The strength of the Rayleigh backscattering based quench detection technique lies in the combination of high spatial resolution with speed. In addition to sensing a hot-spot almost immediately (within one time-cycle), in the results shown here, 5 mm spatial resolution was obtained with a 30 ms measurement rate. This allows for precise localization of the normal zone(s), as well as a quick detection. These features enable the use of minimum propagating zone criterion for identifying a zone that becomes unstable (i.e., detecting a quench). Because of the high spatial resolution, the size of the normal zone can be quickly determined and monitored. Coupled to an understanding of the critical MPZ size, a simple quench detection logic emerges.

There are a number of other key advantages of optical fiber sensing. For example, it is important to appreciate the significance of the ability to identify a hot-spot quickly, well before a voltage signal appears (e.g., at a temperature well below the current sharing temperature). Consider the aforementioned quench protection time budget that must account for detection, decision, and protective action. By detecting the hot-spot immediately, none of the time-budget is wasted waiting for a detectable signal. For voltage-based sensing, the greater the stability margin, the greater the time-budget wasted waiting for a signal to emerge. With the approach proposed here, increased stability margin increases the time budget, so the system is more stable and easier to protect. An additional benefit, which is particularly important for tokamak reactors, is the fact that the measurement is not altered by electromagnetic noise. Thus, there is no "cross-talk" between electromagnetic signals coming from any time-varying magnetic fields generated by other magnets or the plasma itself. The optical fiber is completely immune to electromagnetic variations, so each system operates completely independent and uncoupled from the others.

Turning now to FIGS. 4A-4D, shown are examples of cross-sections of a self-monitoring conducting device 400 (e.g., 400*a*, 400*b*, 400*c*, 400*d*) according to various embodiments of the present disclosure. Specifically, FIGS. 4A-4D illustrate examples of optical fiber sensors 103 integrated into a variety of HTS tape architectures.

Figure 4A:
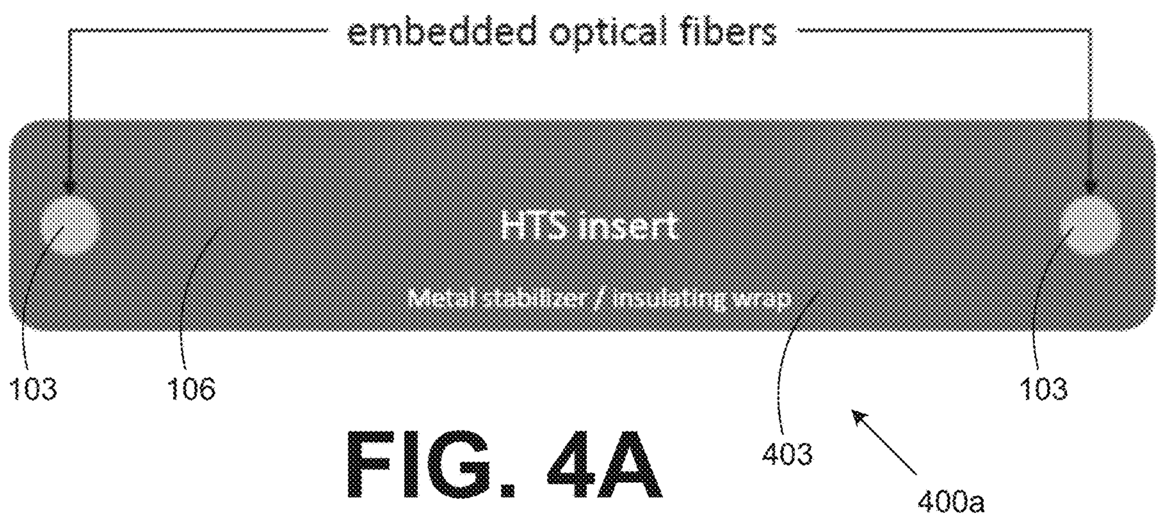
FIGS. 4A-4D illustrate examples of cross-sections of self-monitoring conducting devices according to various embodiments of the present disclosure.

FIG. 4A illustrates optical fibers 103 embedded into an HTS architecture comprising an HTS insert 106 (e.g., REBCO, buffer layers and silver cap) surrounded by a metal stabilizer 403 (e.g., copper, aluminum, bronze, etc.) and insulating wrap 409. The insulating wrap 409 may comprise polymeric materials, such as polyamide and/or any other type of polymer as well as ceramic materials like $TiO_2$ or any other electrically insulating material. In manufacturing the self-monitoring conducting device 400*a* of FIG. 4A, one or more optical fibers 103 are positioned as close to or in contact with the HTS insert 106 or at a minimal distance that allows for packaging and are aligned with the HTS architecture to extend the length of the HTS architecture. The one or more optical fibers 103 can be coated with a coating that is compatible with the insulating wrap 409 or the metal stabilizer 403. In some embodiments, the one or more optical fibers 103 are embedded within the HTS architecture 106 by bonding the optical fibers 103 coated with the compatible coating to the insulating wrap 409.

Figure 4B:
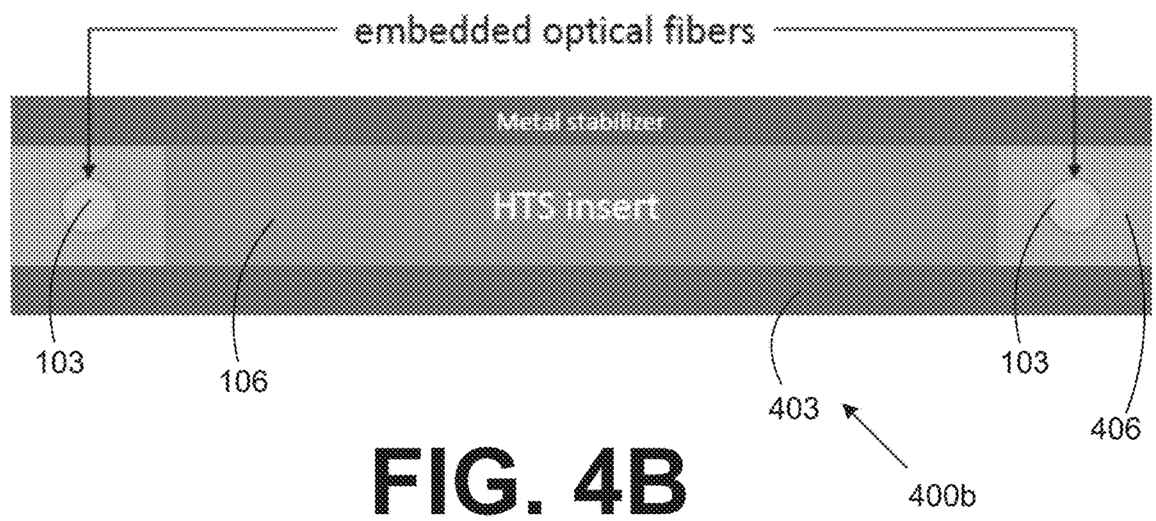

FIG. 4B illustrates optical fibers 103 integrated with the HTS insert 106 to form the self-monitoring conducing device 400*b*. In this example, the self-monitoring conducting device 400*b* comprises an HTS insert 106, a metal stabilizer 403, and optical fibers 103 extending the length of the HTS insert 106. During the manufacture process of the self-monitoring conducting device 400*b* of FIG. 4B, the metal stabilizer 403 is bonded to the top and the bottom of the HTS insert 106. Note that in some embodiments, the metal stabilizer 403 may be present at either of the HTS insert 106 surfaces or may not be present at all. One or more optical fibers 103 may be aligned along the sides of the HTS insert 106 either in contact with it or at a distance that facilitates packaging the conductor effectively. In some embodiments, solder fillets 406 may be used to laminate the metal stabilizer to the top and bottom of the HTS insert 106. As such, the optical fibers 103 may be incorporated within the solder fillets 406 via the soldering process, thereby embedding the optical fibers 103 into the HTS tape architecture 106 to form the self-monitoring conducting device 400. Note that the metal stabilizer 403 may be bonded to either or both bottom and top of the HTS insert 106 or it may be not present at all.

Figure 4C:
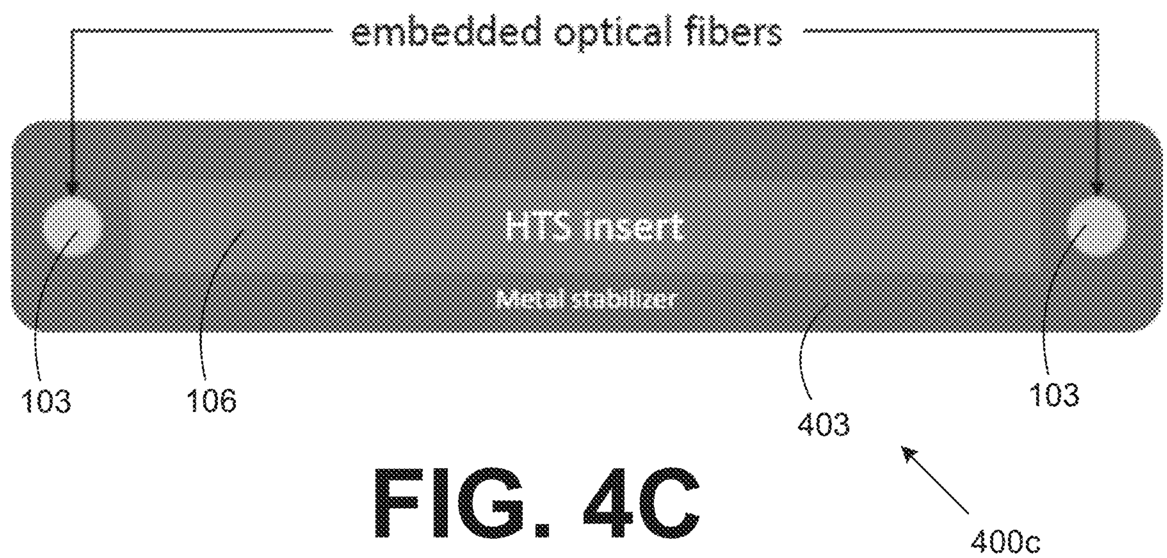

FIG. 4C provides another example of a cross-section of the self-monitoring conducting device 400*c*. The self-monitoring conducting device 100*c* of FIG. 4C comprises an HTS insert 106 encapsulated by a metal stabilizer 403 and optical fibers 103 integrated within the metal stabilizer 403 and extending the length of the HTS insert 106. Similar to the manufacturing process described with respect to FIG. 4B, the optical fibers 103 may be added to the HTS insert 106 during the process (e.g., soldering, electroplating, etc.) of bonding the metal stabilizer 403 to the HTS insert 106 to form the self-monitoring conducting device 400*c*.

Figure 4D:
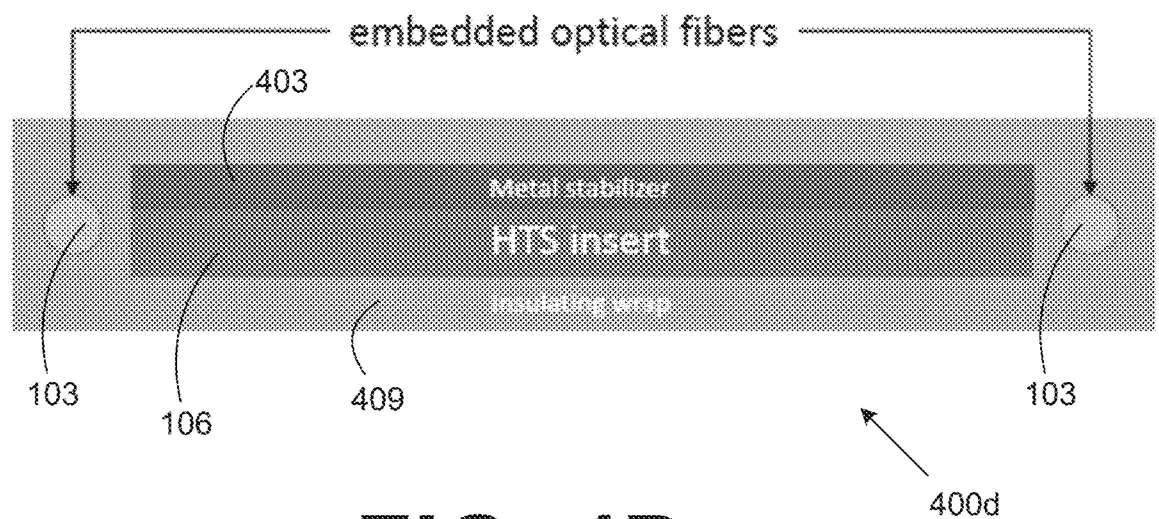

FIG. 4D illustrates another example of a cross-section of the self-monitoring conducting device 400*d* in which the HTS architecture comprises a metal stabilizer bonded to top portion of the HTS insert 106 and an insulating wrap 409 encapsulating the metal stabilizer 403 and the HTS insert 106. Similar to FIG. 4A, the optical fibers 103 of the self-monitoring conducting device 400*d* of FIG. 4D are embedded via a bonding with the insulating wrap 409. The optical fibers 103 may be coated with a polymer that, as can be appreciated, is compatible with the insulating wrap 409.

According to various embodiments of the present disclosure, the optical fibers 103 may comprise a coating compatible, as can be appreciated, with the HTS insert 106, the metal stabilizer 403, and/or the insulating wrap 409. In other embodiments, the optical fibers 103 may not comprise a coating.

Example 1

Figure 5:
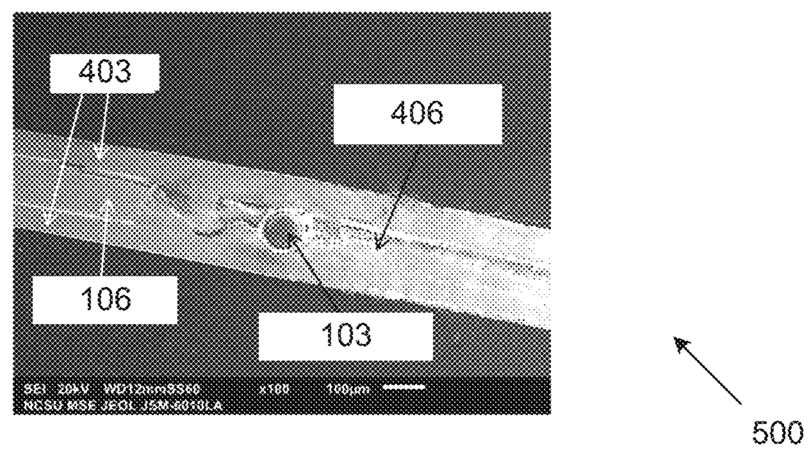
FIG. 5 illustrates another example of a cross-section of a self-monitoring conducting device of FIG. 4B according to various embodiments of the present disclosure.

Turning now to FIG. 5 shown is an example of a SEM micrograph 500 of a self-monitoring conducting device 400 according to various embodiments of the present disclosure. Similar to FIG. 4B, the self-monitoring conducting device 400 comprises an HTS insert 106, a metal stabilizer 403, and optical fibers 103 extending the length of the HTS insert 106. Additionally, the self-monitoring conducting device 400 includes solder fillets 406 surrounding the optical fibers 103 and used to laminate the metal stabilizer to the top and bottom of the HTS insert 106.

Figure 6:
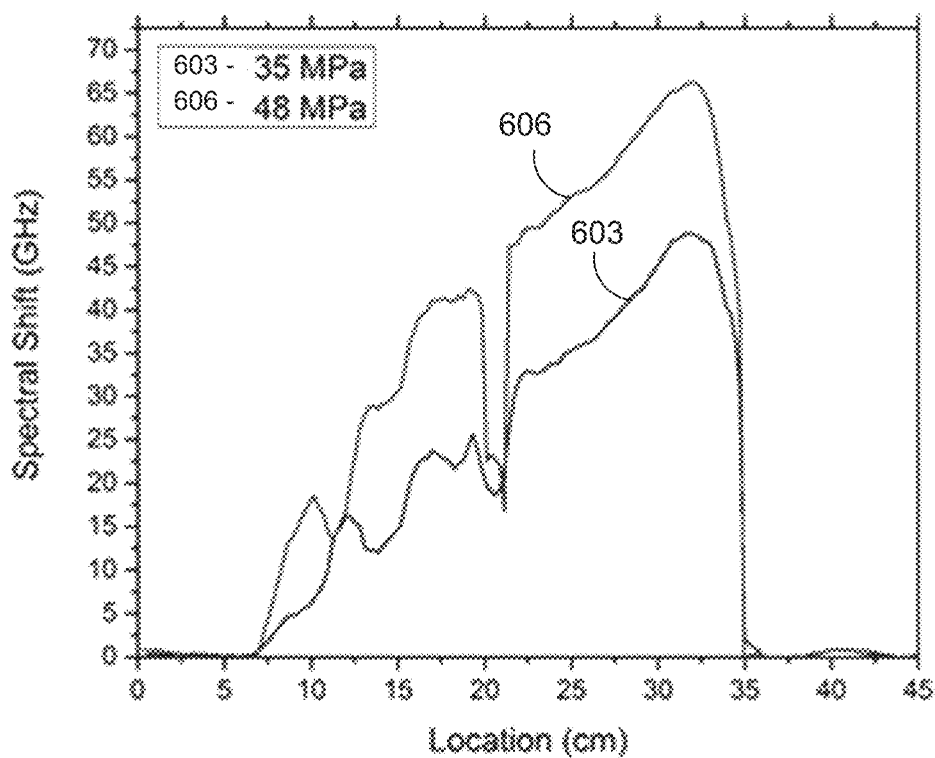
FIG. 6 illustrates an example of a graphical representation of spectral shift due to strain imparted to the self-monitoring conducting device of FIG. 5 according to various embodiments of the present disclosure.
Figure 7:
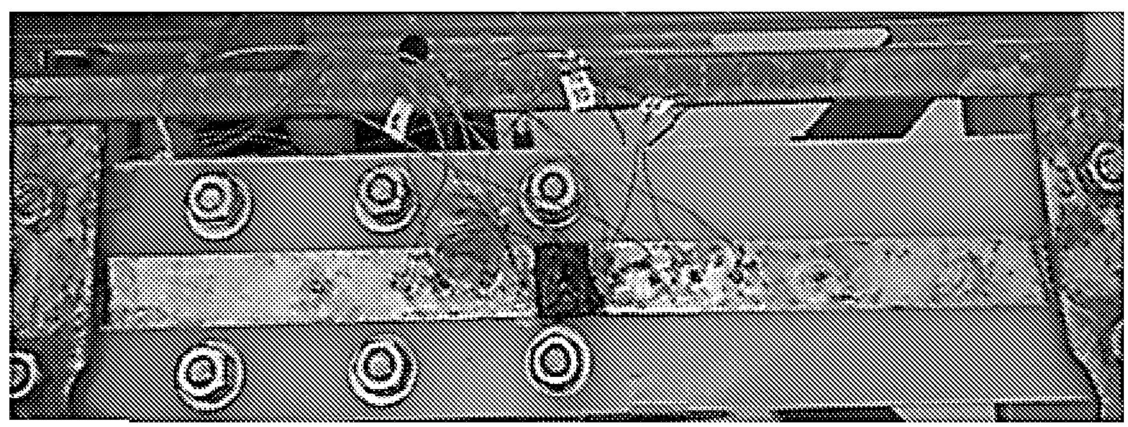
FIG. 7 illustrates an example of a setup used to demonstrate detection of thermal perturbation by the self-monitoring conducting device of FIG. 5 according to various embodiments of the present disclosure.

FIG. 6 illustrates an example of a graphical representation of spectral shift associated with the self-monitoring conducting device of FIG. 5 according to various embodiments of the present disclosure. Specifically, FIG. 6 illustrates spectral shift (proportional to elongation) measured by the self-monitoring conducting device 400 as a function of position with 2.56 mm spatial resolution, at different tensile loads. Note that the strain is just the elongation divided by the length, so in this case spectral shift at position x, divided by x, yields a quantity proportional to strain. The results in FIG. 6 are obtained with a self-monitoring conducting device 400 sample mounted in a tensile test machine and loaded in tension to show the strain measuring capability of the self-monitoring conductor 400. The plots are spectral shift as a function of position along the self-monitoring conducting device 400 sample. FIG. 7 illustrates an example of a setup used to demonstrate detection of thermal perturbation by the self-monitoring conducting device of FIG. 5 according to various embodiments of the present disclosure.

The grips that hold the sample and apply the force are located at about 7 and 35 cm. As it can be noted, the spectral shift is proportional to the elongation that yields the strain if divided by the positional variable. In formulae:

$$ss(x) \propto \Delta L$$

$$\varepsilon = \frac{\Delta L(x)}{L(x)} = \frac{\Delta L(x)}{x} \propto \frac{ss(x)}{x}$$

Where ss(x) is the spectral shift as a function of the position x, ΔL is elongation, L(x)=x is the position on the conductor, ε is the strain.

The results shown in FIGS. 8A-12 are from an experiment that consists of injecting a transport current into the self-monitoring conducting device 400 which is lower than the critical current of the sample and pulse the heater to initiate a normal zone in the sample. Throughout the experiment the spectral shift is measured by the self-monitoring conducting device 400 and voltage and temperature signals are also acquired via voltage taps and thermocouple respectively. This type of experiment aims at showing the capability of the self-monitoring conducting device 400 in detecting and localizing normal zones as compared to conventional voltage taps and thermocouples monitoring (although the latter is not viable in magnets because thermocouples are point sensors and the location of the perturbation in a real system is totally unpredictable, they are used anyway as a further comparison that shows the self-monitoring conducting device 400 unprecedented capabilities).

Figure 8A:
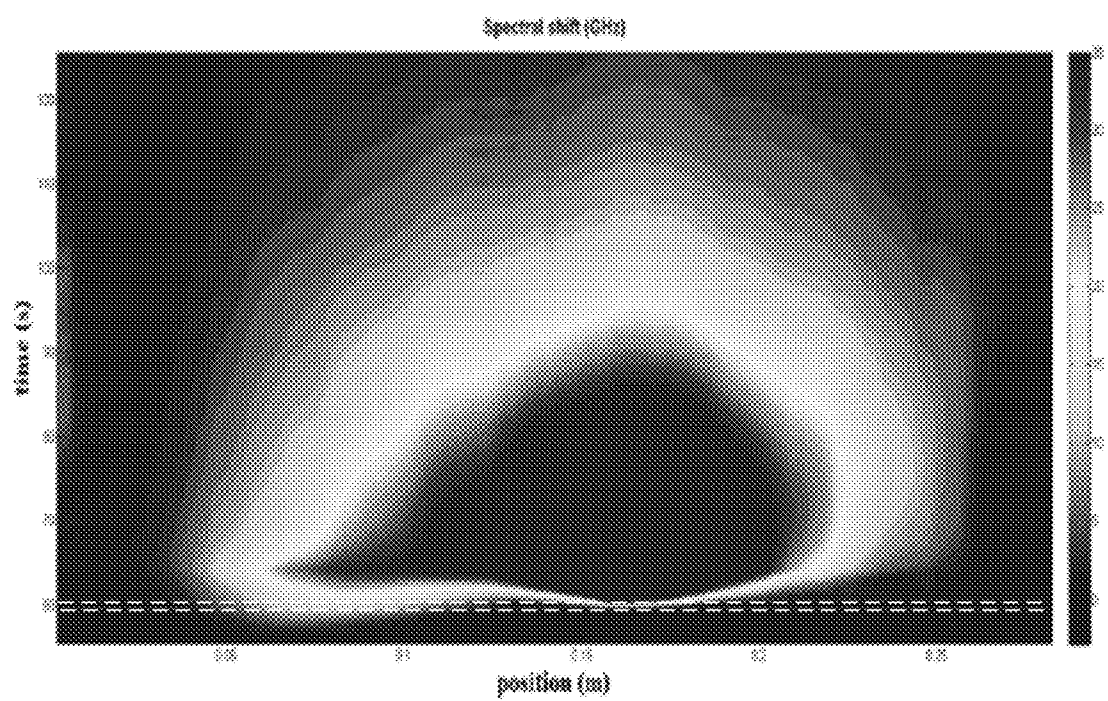
FIGS. 8A and 8B illustrate example graphical representations of the thermal perturbation of the self-monitoring conducting device of FIG. 5 according to various embodiments of the present disclosure.
Figure 8B:
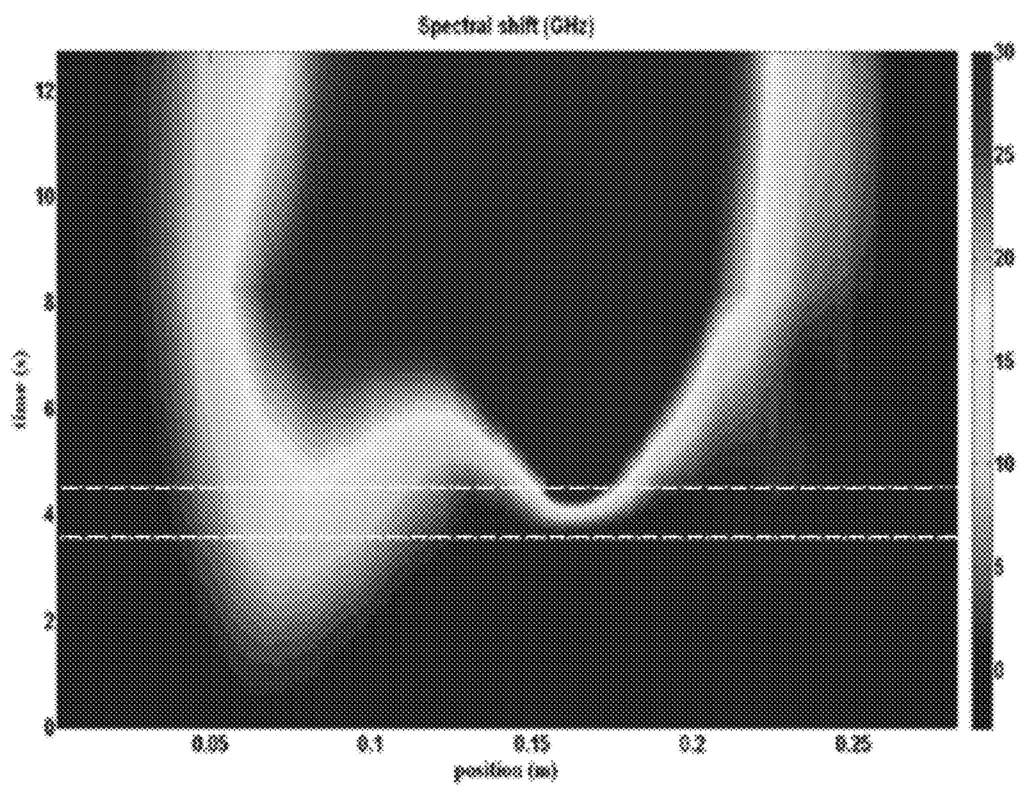

FIGS. 8A and 8B show the spectral shift as a function of time and space measured by the self-monitoring conducting device 400. The heater is positioned at about 0.17 m and the beginning and end of the pulse are marked in FIGS. 8A and 8B. The initial spectral shift builds up at a position away from the heater and before the heater fired, because of the presence of a lower performing spot in the conductor (around 0.065 m).

Figure 9:
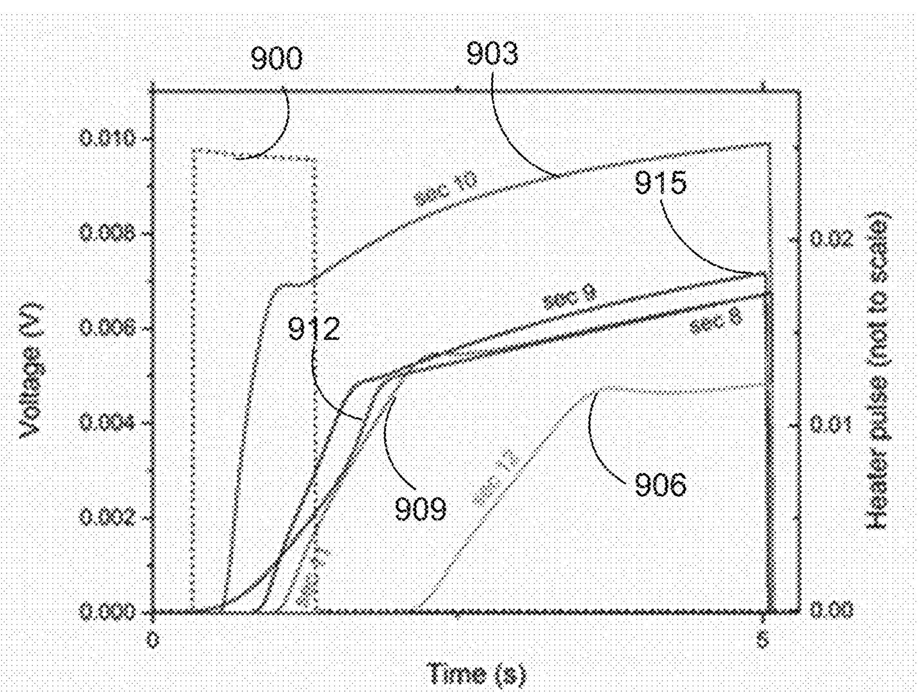
FIG. 9 illustrates an example of a graphical representation of the voltage measured during a quench experiment of the self-monitoring conducting device of FIG. 5 according to various embodiments of the present disclosure.
Figure 10:
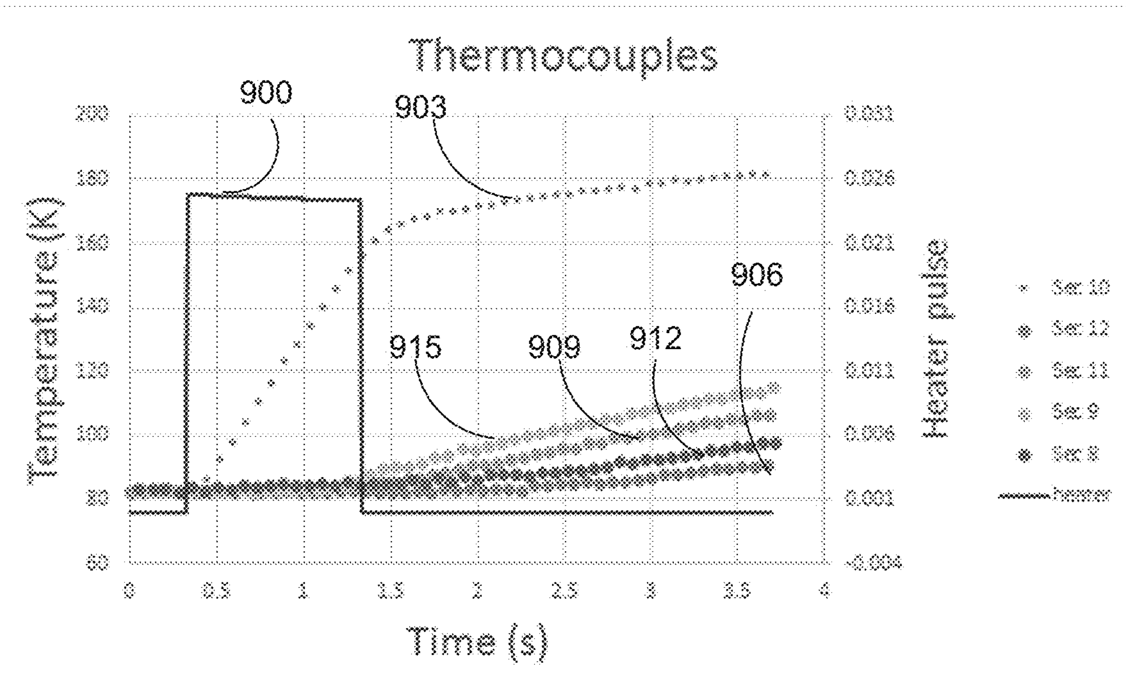
FIG. 10 illustrates an example of a graphical representation of thermocouple data from a quench experiment of the self-monitoring conducting device of FIG. 5 according to various embodiments of the present disclosure.

The voltage and temperature measured during the same experimental run are shown in FIGS. 9 and 10. Specifically, FIG. 9 illustrates an example of a graphical representation of the voltage measured during the quench experiment of the self-monitoring conducting device 400 according to various embodiments of the present disclosure. FIG. 9 illustrates voltage measured at section 912, section 915, section 903, section 909, and section 906 of the self-monitoring conducting tape 400 according to various embodiments of the present disclosure. FIG. 10 illustrates an example of a graphical representation of thermocouple data from the quench experiment of the self-monitoring conducting device 400 according to various embodiments of the present disclosure.

The voltage doesn't increase before the heater pulse 900. Section 8 1012 corresponds to the position where the spectral shift started to build up before the heat pulse, a "bad spot" in terms of conductor performance that initiated a perturbation at that location. No temperature change was measured by the thermocouple on section 912 until the heat pulse 900 occurred. Therefore, the spectral shift was the only signal able to detect the bad spot in the conductor that was the initiator of the perturbation that was then enhanced by the heat pulse 900.

Figure 11:
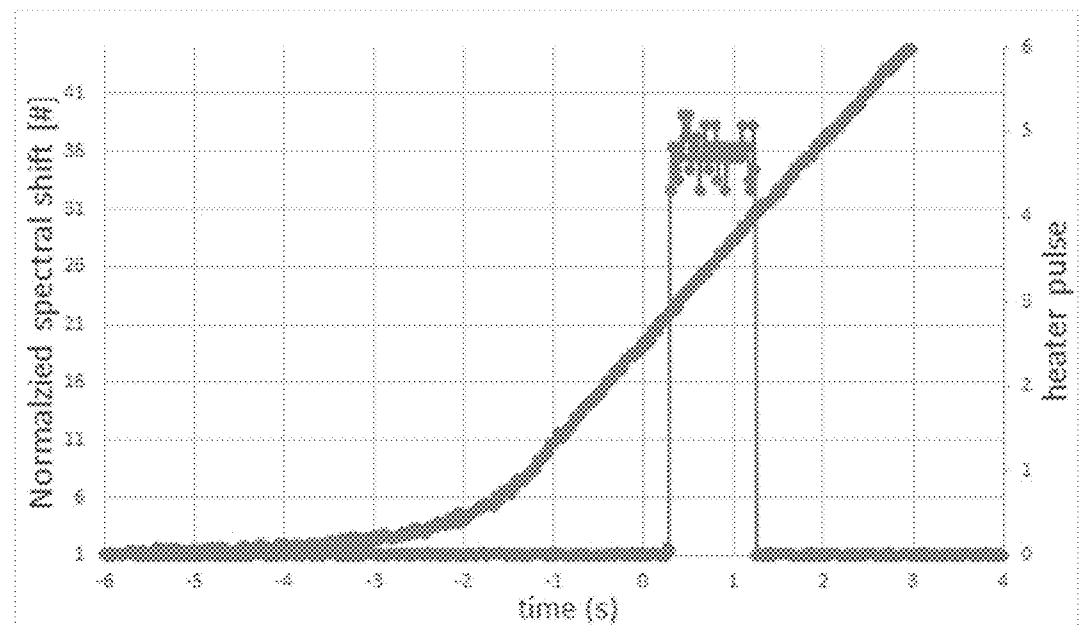
FIG. 11 illustrates an example of a graphical representation of spectral shift at the position of a bad spot detected during a quench experiment by the self-monitoring conducting device of FIG. 5 according to various embodiments of the present disclosure.
Figure 12:
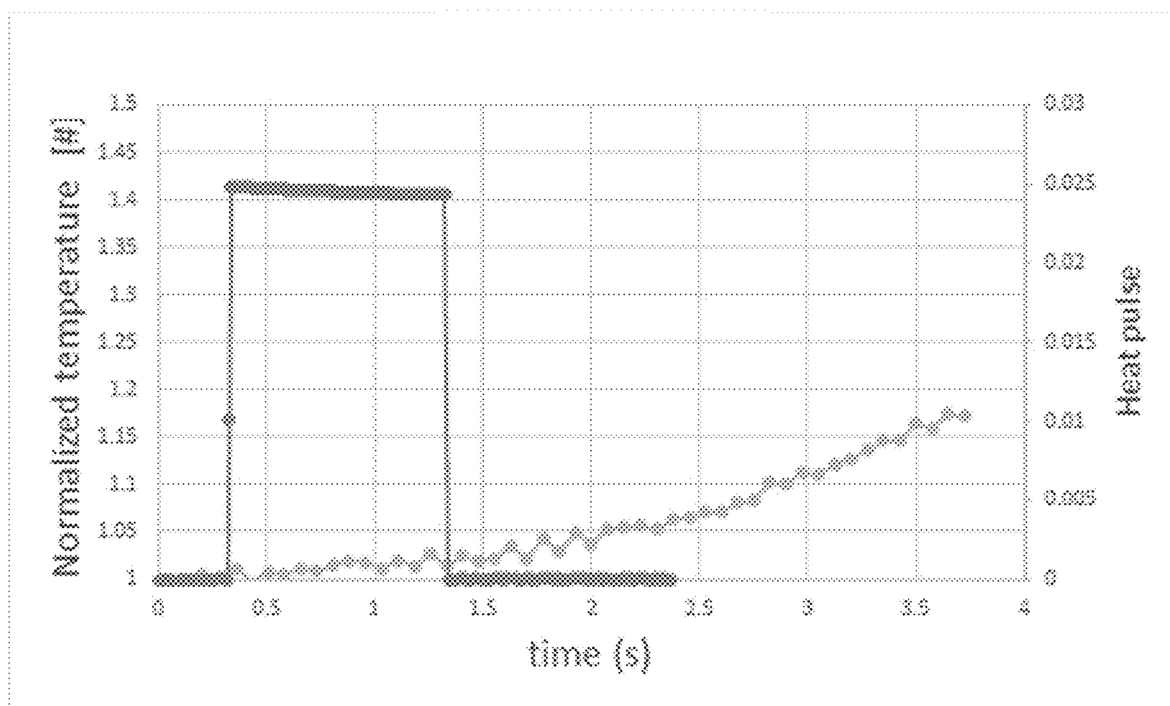
FIG. 12 illustrates an example of a graphical representation of temperature measured by the thermocouple as a function of time from a quench experiment of the self-monitoring conducting device of FIG. 5 according to various embodiments of the present disclosure.

For a more quantitative comparison, FIGS. 11 and 12 contain plots of the spectral shift and temperature, respectively, at the position of the "bad spot" normalized by their respective values before the perturbation occurred. Therefore, the value before the perturbation is "1" and it increases to a value greater than one as the sensors detect the perturbation. The spectral shift had already increased to a value multiple times higher than the unperturbed one and was more than twenty (20) times the unperturbed values before the heat pulse 900. The thermocouple only increases above the unperturbed value after the heater pulse and even seconds after the heat pulse it's only increased to 1.1 the unperturbed value. This superior sensitivity of the spectral shift compared to the thermocouple is to be attributed to the position of the optical fiber relative to the position to the thermocouple. The optical fiber 103 is embedded into the conductor 400, which is where the perturbation emerges, whereas the thermocouple is—and can only be—attached to the surface of the conductor 400.

Example 2

While the embodiments of FIGS. 4A-4D illustrated examples of a self-monitoring conducting device 400 comprising optical fibers embedded within conducting components (e.g. HTS tape architectures, REBCO tape, superconducting wire, etc.) other embodiments of the present disclosure comprise a self-monitoring system 1300 (FIGS. 13A-13H) comprising one or more optical fibers integrated in combination with a conducting component (e.g., HTS architectures, REBCO tape, BSCCO, low temperature superconductors, NbTi, $MgB_2$, $NB_3Sn$ wire superconducting wire, etc.), but not necessarily embedded within. This self-monitoring system 1300 can be configured to sense or detect changes associated with temperature, strain changes, and/or radiation. For example, the self-monitoring system can be co-wound about a superconducting magnet (SM) and can be configured to sense and/or detect temperature, strain, and/or radiation changes associated with the magnet.

In one non-limiting example, the temperature sensing capabilities of Rayleigh backscattering interrogated optical fibers can be used to detect temperature changes in a magnet, of any magnitude above the temperature resolution of the fiber. In another non-limiting example, optical fibers can be used to detect any strain experienced by the magnet due to Lorentz forces, mechanical perturbations, impregnation failure and thermal stresses due to temperature changes, for example during magnet cool down.

In another non-limiting example, by measuring the intensity of the Rayleigh backscattering in a fiber, radiation can be detected and/or the amount of energy that the radiation released in the optical fiber can be resolved based at least in part on the position of the optical fiber. Indeed, both the intensity of Rayleigh backscattering and spectral shift in an Optical Frequency Domain Reflectometry (OFDR) via Rayleigh backscattering interrogated optical fibers can be used for radiation detection and dosimetry. The change in intensity of the Rayleigh backscattering relates to the change in a radiation environment and/or radiation load because new crystallographic defects are created in the fiber. In some embodiments of the present disclosure, the self-monitoring system can localize the perturbations (e.g., temperature change, strain change, radiation change) with high spatial resolution.

According to various embodiments, the self-monitoring system 1300 (FIGS. 13A-13H) can be used to make a magnet by winding them into specific configurations, forming the desired magnetic field distribution, or integrated with a magnet by co-winding the superconducting magnet with a superconducting component (e.g. HTS tape architecture, NbTi or $NB_3Sn$ wire, superconducting wire, etc.) to form pancakes or layer wound coils, with the optical fiber running at the edge or on top of the superconducting component. In one non-limiting example, the one or more fibers 103 may be disposed on top of the conducting component. In another non-limiting example, the one or more fibers 103 may be co-wound about the magnet in parallel with the conducting component. In some embodiments, the optical fiber(s) 103 is coupled to the superconducting component. For example, the optical fiber 103 may be coupled to an insulation portion of the superconducting component via an adhesive and/or any other type of anchoring component, as can be appreciated. In another embodiment, the optical fiber 103 may be coupled to the superconducting component via embedding in epoxy and/or any other type of impregnation medium as can be appreciated. In other embodiments, the self-monitoring system 1300 can comprise one or more optical fibers integrated into structural material supporting the superconducting winding of the superconducting component.

In another embodiment, the self-monitoring device can comprise one or more optical fibers 103 integrated into superconducting cables. For example, the optical fibers can be integrated into the superconducting cable running along with the superconducting component in a wire bundle. In another example, the one or more optical fibers 103 can be integrated into the superconducting cable running along with the superconducting component in a surrounding.

Figure 13A:
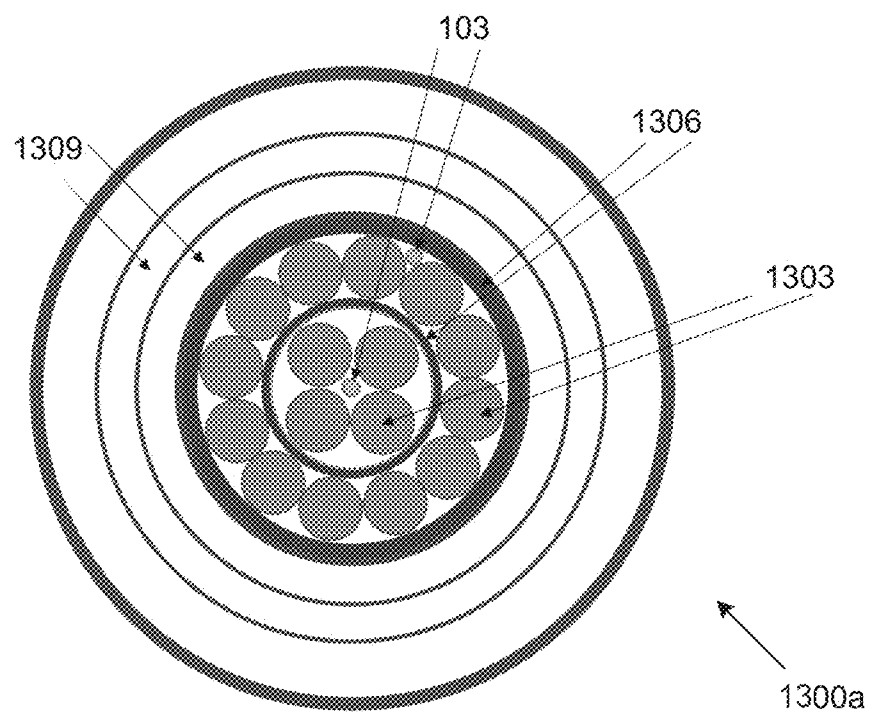
FIGS. 13A-13H illustrate examples of cross-sections of a self-monitoring system according to various embodiments of the present disclosure.

Turning now to FIGS. 13A-13H, shown are examples of cross-sections of self-monitoring systems 1300 (e.g., 1300*a*, 1300*b*, 1300*c*, 1300*d*, 1300*e*, 1300*f*, 1300*g*, 1300*h*) according to various embodiments of the present disclosure. For example, FIG. 13A illustrates an example of a self-monitoring system 1300*a* according to various embodiments. The self-monitoring system 1300*a* of FIG. 13A comprises a power transmission cable comprising optical fibers 103, superconducting architectures 1303 (e.g., superconducting wire), insulation material 1306, and one or more cooling jackets 1309. In the example of FIG. 13A, a first optical fiber 103 is disposed centrally about the cable and is surrounded by a first group of superconducting architectures 1303. A second optical fiber 103 is disposed adjacent to a second group of superconducting architectures 1303 surrounding the first set of superconducting architectures 1303. Each concentric group is separated by the electrical insulation 1306. Each concentric group of conducting material may or may not represent a different phase for power transmission (e.g., three phase cables).

According to various embodiments, cooling jackets 1309 are disposed about the outer layer of electrical insulation 1306 that surrounds the second group of superconducting architecture 1303. It should be noted that while the self-monitoring system 1300*a* illustrates two layers of superconducting architectures 1303 and optical fibers 103, the self-monitoring system 1300*a* may comprise more or less layers as can be appreciated. Each layer may or may not represent a different phase for power transmission.

Figure 13B:
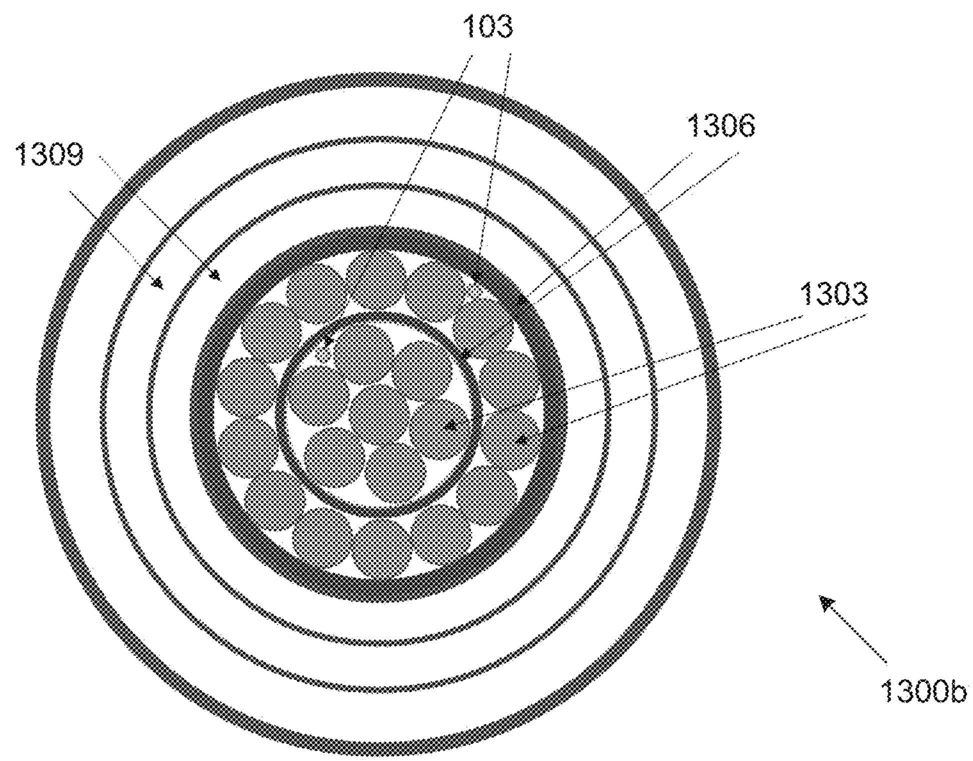

FIG. 13B illustrates another example of a self-monitoring system 1300*b* according to various embodiments of the present disclosure. Specifically, similarly to FIG. 13A, FIG. 13B illustrates a self-monitoring system 1300*b* comprising a power transmission cable. In contrast to FIG. 13A, the first optical fiber 103 is not centrally located, but is rather disposed adjacent to a first group of superconducting architectures 1303 that is centrally placed.

Figure 13C:
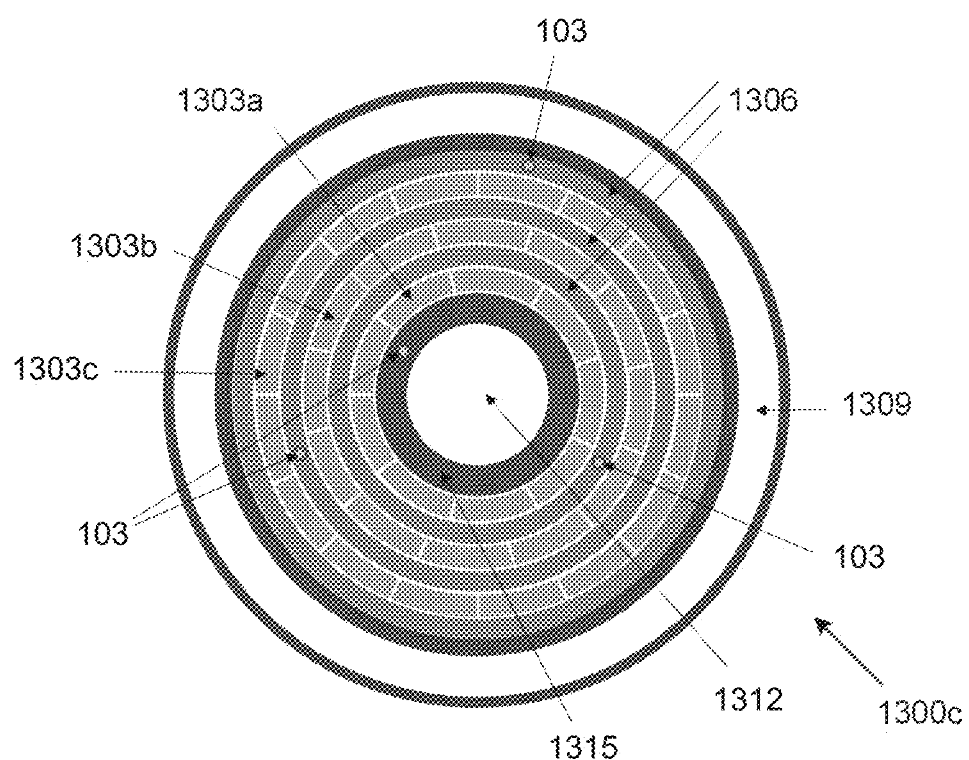

FIG. 13C illustrates another example of a self-monitoring system 1300*c* according to various embodiments of the present disclosure. Similarly to FIGS. 13A and 13B, the self-monitoring system 1300*c* of FIG. 13C comprises a power transmission cable. In contrast to FIGS. 13A and 13B, the self-monitoring system 1300*c* of FIG. 13 comprises multiple optical fibers 103 disposed adjacent to multiple layers of a superconducting architecture 1303 (e.g., superconducting tape) surrounding a centrally located cooling channel 1312. Each layer of superconducting architecture 1303 is separated from an adjacent layer via an insulation 1306. For example, in FIG. 13C, the centrally located cooling channel 1312 is surrounded by a former 1315 (e.g., copper). According to various embodiments, optical fiber(s) 103 may be disposed adjacent to the superconducting architecture 1303 by embedding the optical fiber(s) 103 in the former 1315, insulation layer(s) 1306, superconducting structure (forming a self-monitoring conducting element similar to 400*a* to 400*d* and 500) and/or any other arrangement as can be appreciated.

Figure 13D:
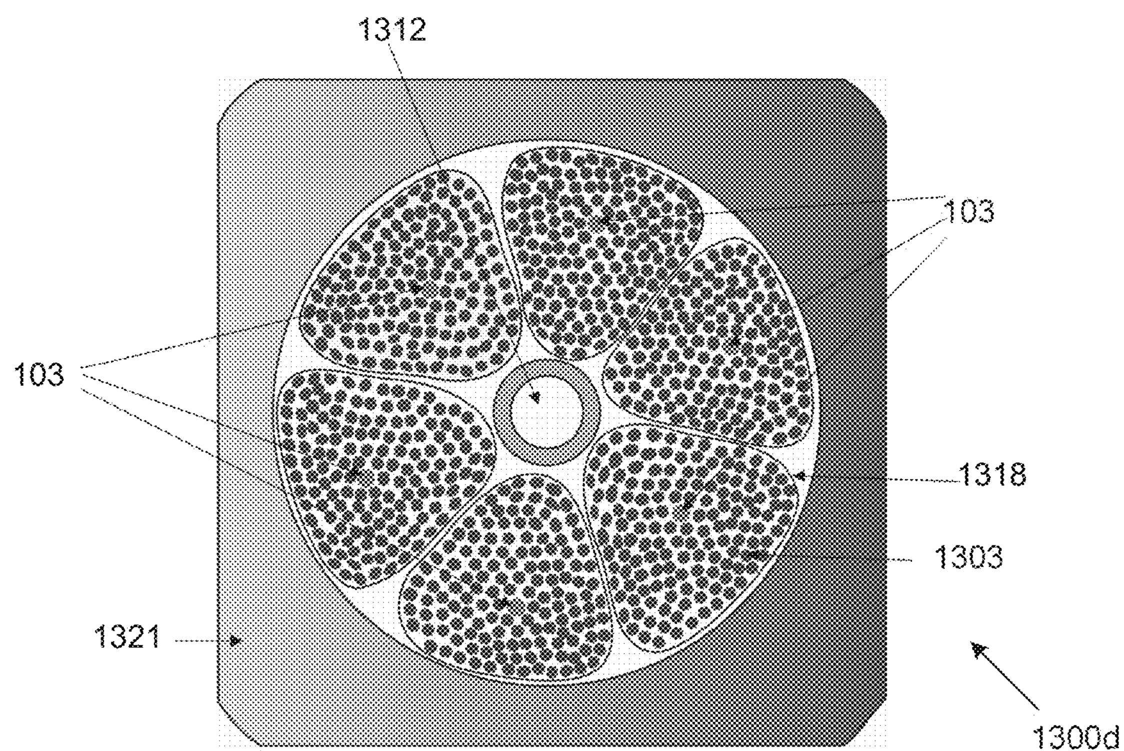

Turning now to FIG. 13D, shown is an example of a cross-section of a self-monitoring system 1300*d* according to various embodiments of the present disclosure. The self-monitoring system 1300*d* of FIG. 13D comprises a cable in conduit conductor (CICC) comprising bundles 1318 of superconducting architecture 1303 (e.g., superconducting wire) surrounding a cooling channel 1312. In one or more bundles 1318 of the superconducting architecture 1303, optical fiber(s) 103 are disposed within the bundles 1318 and arranged adjacent to one or more of the superconducting architecture 1303 in the respective bundle 1318. The arrangement of bundles 1318 of superconducting architecture 1303 is surrounded by a structural jacket 1321, as can be appreciated.

Figure 13E:
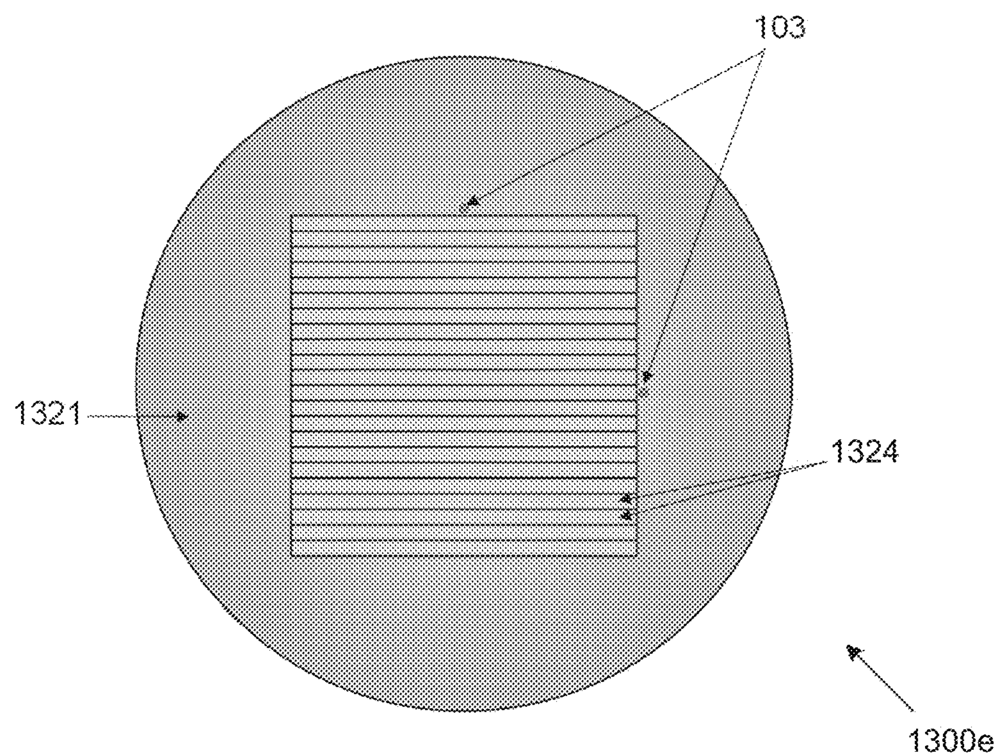

Moving on to FIG. 13E, shown is an example of a cross-section of a self-monitoring system 1300*e* according to various embodiments of the present disclosure. The self-monitoring system 1300*e* of FIG. 13E comprises a twisted stacked REBCO cable comprising optical fibers 103 disposed adjacent to a stack of HTS conductors 1324 and surrounded by a structural jacket 1321.

Figure 13F:
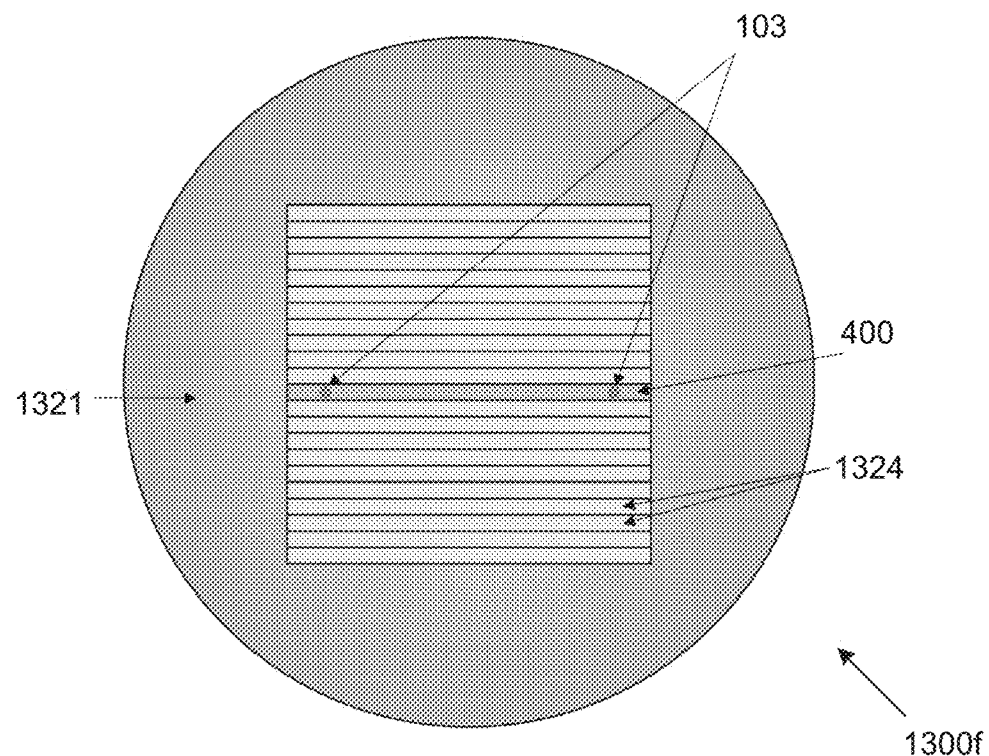

FIG. 13F illustrates another example of a cross-section of a self-monitoring system 1300*f* according to various embodiments of the present disclosure. Similarly to FIG. 13E, the self-monitoring system 1300*g* of FIG. 13F comprises a twisted stacked REBCO cable. In contrast to FIG. 13E, the self-monitoring system 1300*f* of FIG. 13F comprises a structural jacket 1321 surrounding a self-monitoring conducting device 400 stacked with multiple HTS conductors 1324 (e.g. REBCO conductors) that are not embedded with optical fibers 103. While the self-monitoring system 1300*f* of FIG. 13F illustrates the self-monitoring conducting device 400 centrally located in the stack, it should be noted that the self-monitoring conducting device 400 can be located in other areas of the stack.

Figure 13G:
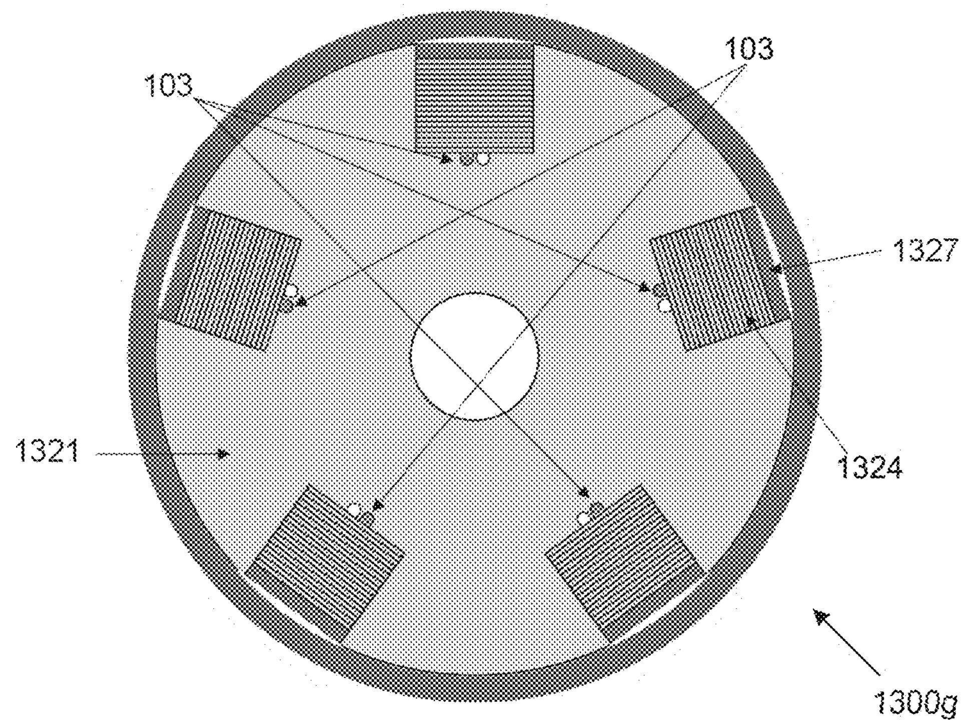

Referring next to FIG. 13G, shown is an example of a cross-section of a self-monitoring system 1300*g* according to various embodiments of the present example. Similarly to FIGS. 13E and 13F, the self-monitoring system 1300*g* of FIG. 13G illustrates an example of a twisted stacked REBCO cable. In contrast to FIGS. 13E and 13F, the self-monitoring system 1300*g* comprises multiple stacks of HTS conductors 1324 (e.g., REBCO conductors) stacked on top of one another and situated within a structural jacket 1324. Optical fiber(s) 103 are disposed adjacent to each stack of HTS conductors 1324. In addition, a copper layer 1327 is disposed on an adjacent end of the stack of superconductor architectures 1324.

Figure 13H:
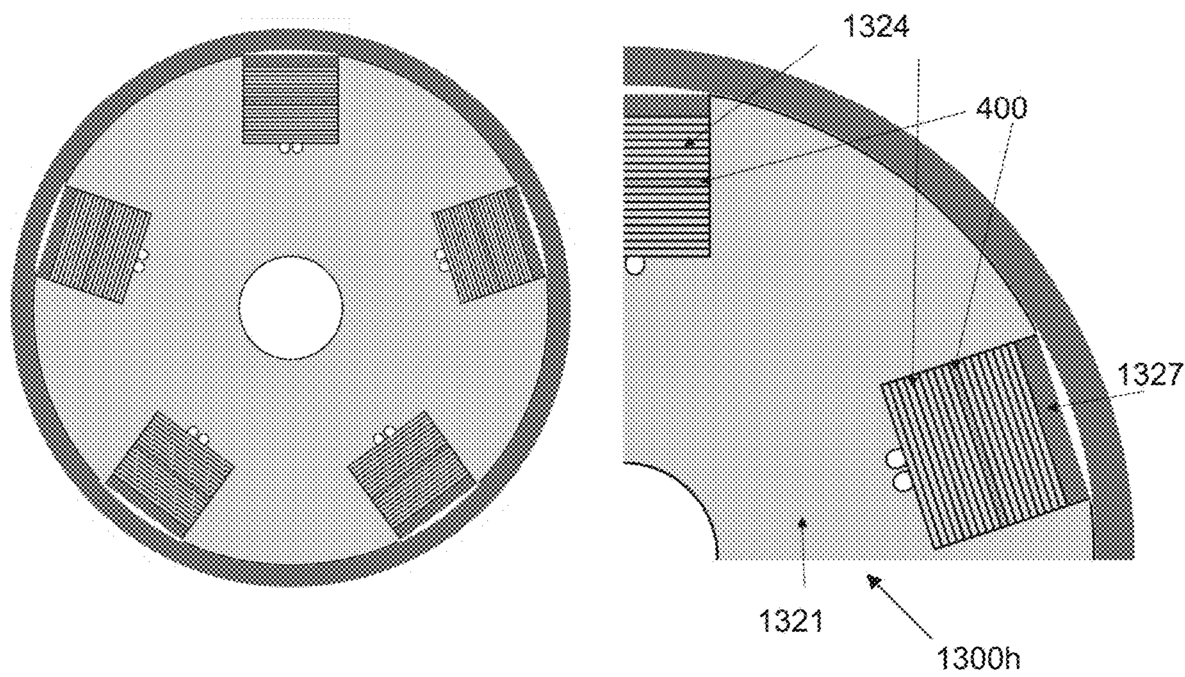

Moving on to FIG. 13H, shown is an example of a cross-section of a self-monitoring system 1300H according to various embodiments of the present disclosure. Similarly to FIGS. 13E-13G, the self-monitoring system 1300*h* of FIG. 13*g* illustrates an example of a twisted stacked REBCO cable. Further, similarly to FIG. 13G, the self-monitoring system 1300*h* of FIG. 13H comprises multiple stacks of conductors similar to those of FIG. 13E situated within a structural jacket 1321. However, while the self-monitoring system 1300*g* of FIG. 13G comprises a plurality stacks similar to the stacks of HTS conductors 1324 shown in FIG. 13E, the self-monitoring system 1300*h* of FIG. 13H comprises multiple stacks similar to those of FIG. 13F which includes a self-monitoring conducting device 400 and multiple HTS conductors 1234 included in the stack.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

The invention claimed is:

1. A high-temperature superconductor (HTS) laminate structure, comprising:

an HTS-based insert extending from a first end to a second end;

one or more optical fibers coupled to the HTS-based insert and extending along a length of the HTS-based insert from the first end to the second end of the HTS-based insert for the HTS laminate structure;

an encapsulate surrounding the HTS-based insert and the one or more optical fibers, wherein the encapsulate is in contact with the HTS-based insert and the one or more optical fibers, wherein the encapsulate comprises a metal stabilizer; and an optical distributed sensor interrogator coupled to the one or more optical fibers of the HTS laminate structure to receive an optical signal that is Rayleigh backscattered from the one or more optical fibers along the length of the HTS-based insert for the HTS laminate structure.

2. The HTS laminate structure of claim 1, wherein the metal stabilizer is laminated to a top and to a bottom of the HTS-based insert via solder fillets.

3. The HTS laminate structure of claim 2, wherein the one or more optical fibers are embedded within the encapsulate via the solder fillets.

4. The HTS laminate structure of claim 3, wherein the metal stabilizer is bonded to the HTS-based insert via electroplating.

5. The HTS laminate structure of claim 1, wherein the one or more optical fibers comprise a distributed sensor configured to monitor a state of the HTS laminate structure along the length of the HTS laminate structure.

6. The HTS laminate structure of claim 5, wherein the one or more optical fibers are used to detect a normal zone.

7. The HTS laminate structure of claim 6, wherein the normal zone is detected based at least in part on Rayleigh scattering.

8. The HTS laminate structure of claim 1, wherein the optical distributed sensor interrogator comprises a light source, a detector, and an anti-reflective termination, the light source being coupled to the one or more optical fibers at an end, the detector coupled to the one or more optical fibers at the same end, and the anti-reflective termination coupled to another end of the one or more optical fibers.

9. The HTS laminate structure of claim 1, wherein the HTS-based insert comprises at least one of rare earth barium copper oxide (REBCO) superconducting material or bismuth strontium calcium copper oxide (BSCCO) superconducting material.

10. The HTS laminate structure of claim 1, wherein the one or more optical fibers are embedded within the encapsulate via solder.

11. The HTS laminate structure of claim 1, wherein the one or more optical fibers are coated with a coating compatible with the metal stabilizer.

12. The HTS laminate structure of claim 1, wherein the one or more optical fibers are in contact with the HTS-based insert.

13. The HTS laminate structure of claim 1, further comprising an insulating wrap that encapsulates the metal stabilizer.

14. The HTS laminate structure of claim 1, wherein the one or more optical fibers are uncoated.

* * * * *